(12) United States Patent
Yu et al.

(10) Patent No.: US 8,393,692 B2
(45) Date of Patent: Mar. 12, 2013

(54) SLIDING MECHANISM

(75) Inventors: Mo-Ming Yu, Shenzhen (CN); Ze-Hong Chen, Shenzhen (CA)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 354 days.

(21) Appl. No.: 12/862,726

(22) Filed: Aug. 24, 2010

(65) Prior Publication Data
US 2011/0280507 A1 Nov. 17, 2011

(30) Foreign Application Priority Data
May 11, 2010 (CN) .......................... 2010 1 0168972

(51) Int. Cl.
*A47B 88/04* (2006.01)
(52) U.S. Cl. .................. 312/333; 312/334.45
(58) Field of Classification Search ............... 312/334.1, 312/334.7, 334.8, 334.11, 333, 334.44, 334.46, 312/334.47, 319.1, 334.45; 384/20, 21, 22
See application file for complete search history.

(56) References Cited

U.S. PATENT DOCUMENTS

| 7,654,624 | B2 * | 2/2010 | Huang et al. | 312/333 |
| 2008/0034662 | A1 * | 2/2008 | Peng et al. | 49/175 |
| 2008/0111457 | A1 * | 5/2008 | Ji et al. | 312/334.44 |
| 2008/0124009 | A1 * | 5/2008 | Peng et al. | 384/21 |
| 2008/0135714 | A1 * | 6/2008 | Huang et al. | 248/429 |
| 2008/0315741 | A1 * | 12/2008 | Huang et al. | 312/334.7 |
| 2009/0001864 | A1 * | 1/2009 | Huang et al. | 312/333 |

* cited by examiner

*Primary Examiner* — James O Hansen
(74) *Attorney, Agent, or Firm* — Altis Law Group, Inc.

(57) ABSTRACT

A sliding mechanism includes an outer rail, an inner rail, a middle rail and a latching assembly. The middle rail has a resisting portion and is slidably mounted to the outer rail and the inner rail is slidably mounted to the middle rail. The latching assembly includes a first protrusion, a second protrusion, a third protrusion, a first roller and a second roller, a latching slot and a stopping surface. When the inner rail slides relative to the middle rail, the first protrusion resists the first roller so the middle rail sliding with the inner rail; and then the first roller slides along the third protrusion to release the first roller from the first protrusion. The second roller then slides in the latching slot until the resisting portion resists the stopping surface; and then the first roller slides along the first protrusion so the inner rail further extends relative to the middle rail.

16 Claims, 8 Drawing Sheets

SLIDING MECHANISM

CROSS-REFERENCE TO RELATED APPLICATIONS

This application is related to co-pending U.S. patent application Ser. No. 12/861,900 entitled "SLIDING MECHANISM", by Yu et al. This application has the same assignee as the present application and has been concurrently filed herewith. The above-identified applications are incorporated herein by reference.

BACKGROUND

1. Technical Field

This disclosure relates to sliding mechanisms, particularly relates to sliding mechanisms used in servers.

2. Description of Related Art

A typical sliding mechanism of a server generally includes an inner rail, a middle rail, and an outer rail. The inner rail is mounted on the server, the outer rail is mounted to a support frame of the server, and the middle rail is mounted between the inner rail and the outer rail to extend the sliding distance of the sliding mechanism. However, in the conventional product configurations, the sliding mechanisms can be complicated and provide size inefficiencies, as they tend to take up a lot of space.

Therefore, there is a room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary sliding mechanism for server. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
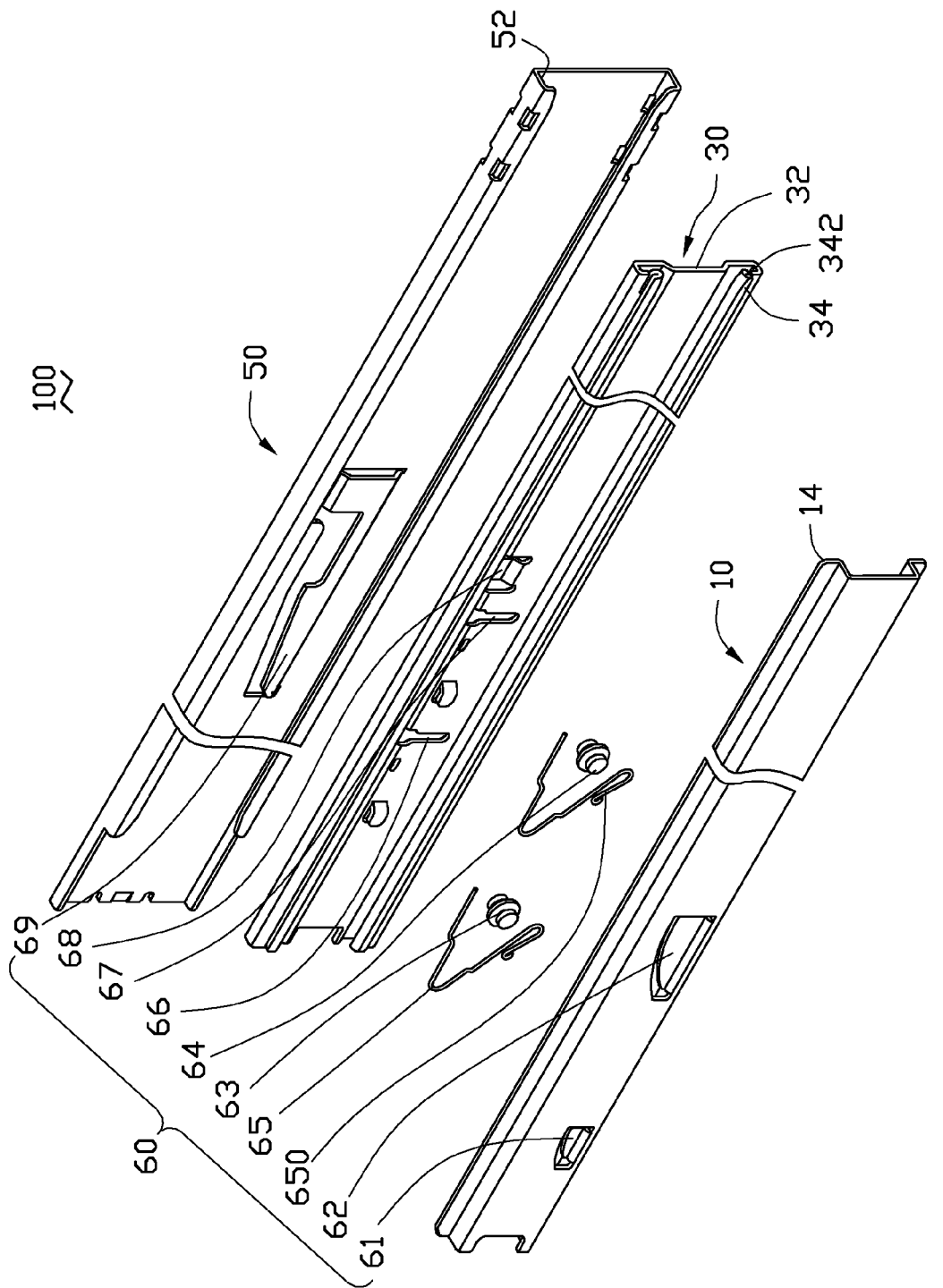
FIG. 1 is an exploded view of an exemplary embodiment of a sliding mechanism.
Figure 2:
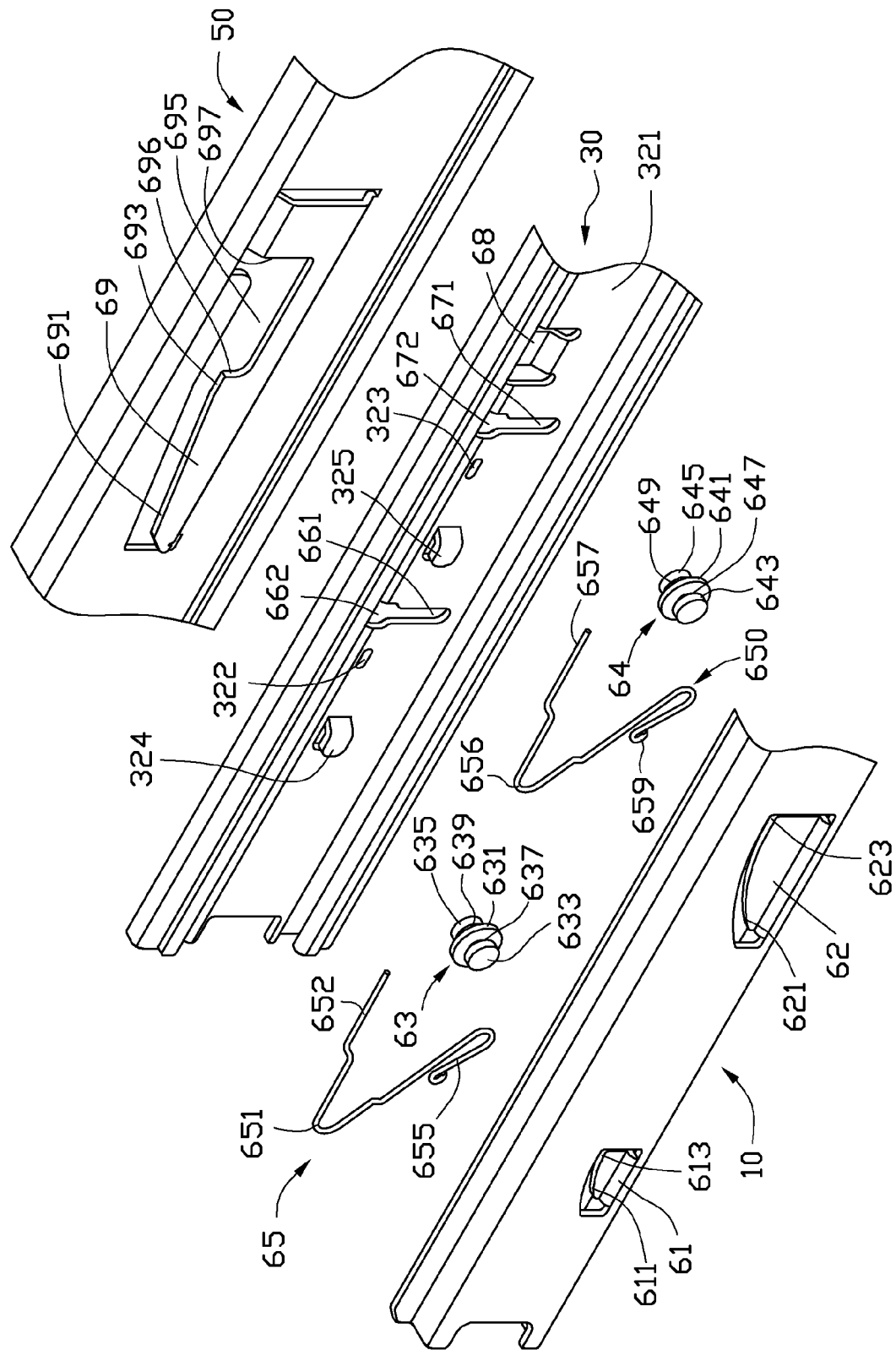
FIG. 2 is partially enlarged view of the sliding mechanism shown in FIG. 2.
Figure 3:
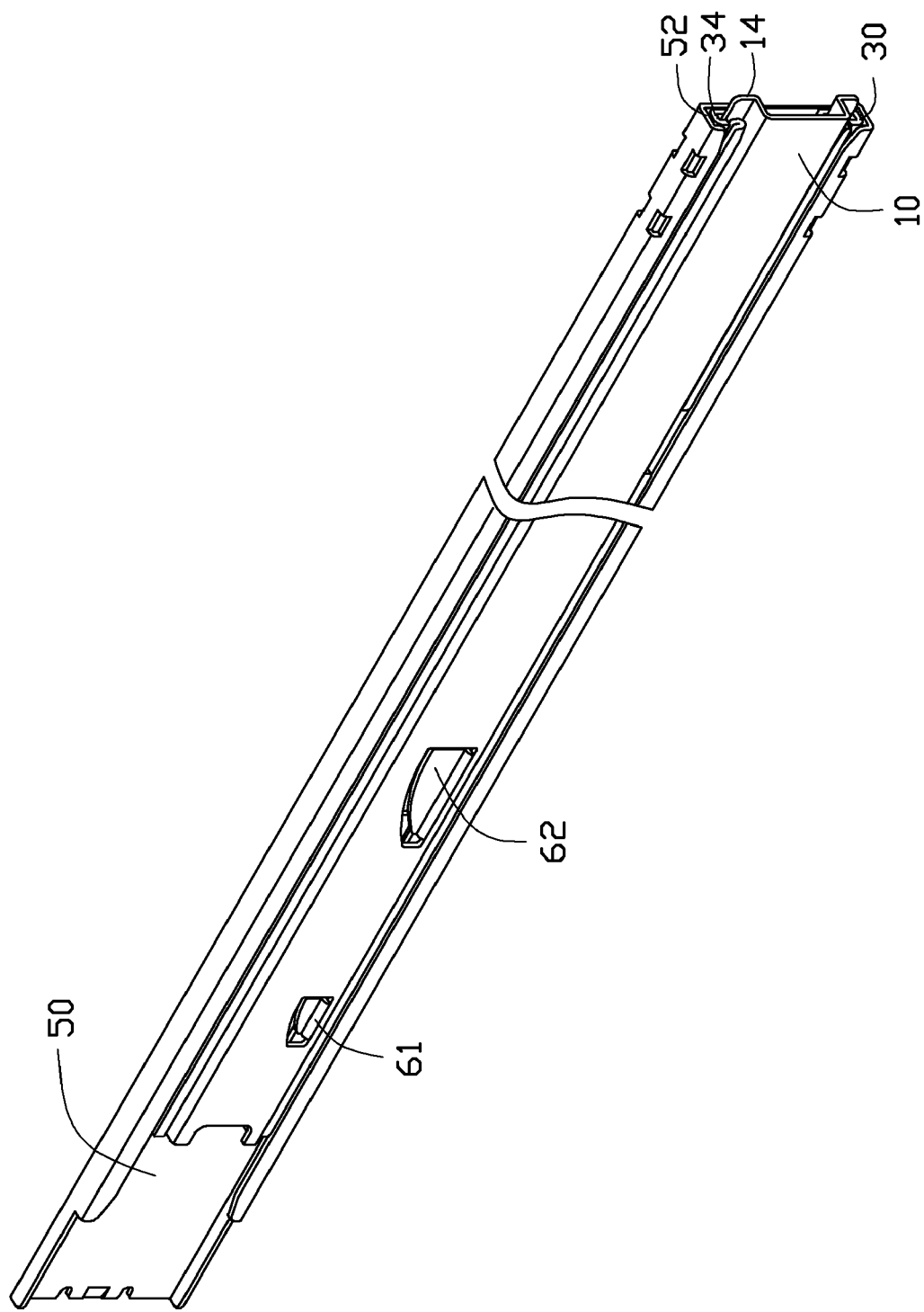
FIG. 3 is an assembled view of the sliding mechanism shown in FIG. 1.
Figure 4:
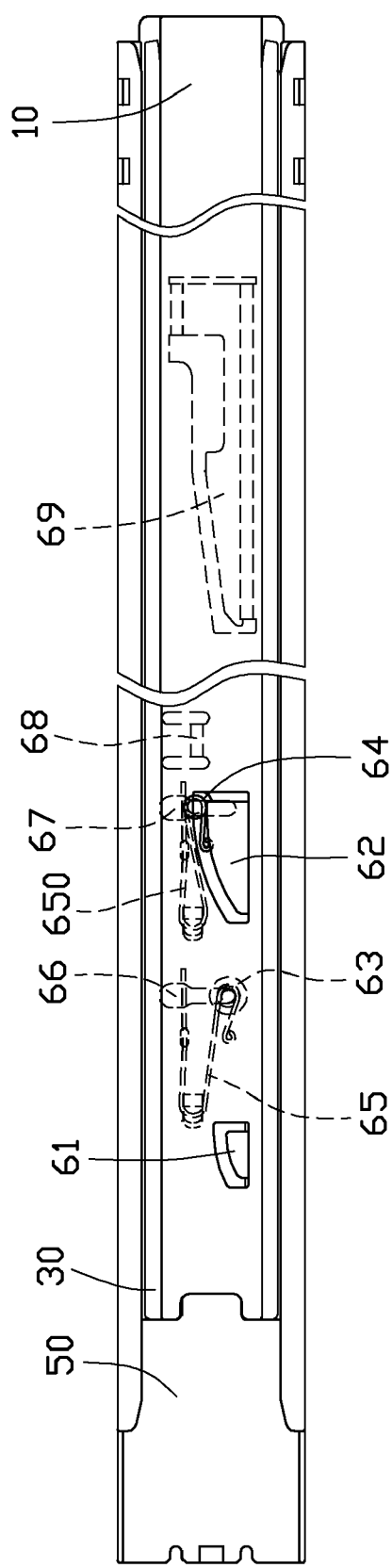
FIGS. 4-8 show the sliding mechanism shown in FIG. 3 in different states.

An exemplary embodiment of a sliding mechanism 100 is shown in FIGS. 1-3. The sliding mechanism 100 includes an inner rail 10, a middle rail 30, an outer rail 50, and a latching assembly 60. The middle rail 30 is mounted between the inner rail 10 and the outer rail 50. The latching assembly 60 includes a first protrusion 61, a second protrusion 62, a first position member such as a roller 63, a second position member such as a roller 64, a first elastic element 65, a second elastic element 650, a first sliding groove 66, a second sliding groove 67, a resisting portion 68 and a third protrusion 69. The first protrusion 61 and the second protrusion 62 are both positioned on the inner rail 10; the first sliding groove 66, the second sliding groove 67, and the resisting portion 68 are positioned on the middle rail 30; the third protrusion 69 is positioned on the outer rail 50.

The inner rail 10 includes two sliding plates 14 respectively located at opposite sides thereof. The first protrusion 61 is substantially arcuate, including a first protrusion valley 611 and a first protrusion peak 613. The first protrusion 61, in this exemplary embodiment, is positioned at one side of the inner rail 10 facing the middle rail 30 and near one end of the inner rail 10. The second protrusion 62 has substantially the same shape as, but is larger than the first protrusion 61, and the second protrusion 62 is situated at the same side as the first protrusion 61. The second protrusion 62 is located at another end of the inner rail 10 and includes a second protrusion valley 621 and a second protrusion peak 623.

The middle rail 30 includes two sliding blocks 34 respectively positioned at opposite sides thereof. The sliding blocks 34 are for slidably engaging with the outer rail 50 so the outer rail 50 can slide relative to the middle rail 30. Each sliding block 34 defines a sliding groove 342 facing the other sliding block 34. Each sliding groove 342 slidably engages one of the sliding plates 14 to enable the middle rail 30 to slide relative to the inner rail 10. The middle rail 30 further includes a first hook 324 for latching the first elastic element 65 to the middle rail 30. A first opening 322 for the first elastic element 65 to pass through the middle rail 30, a second hook 325 for latching the second elastic element 650 to the middle rail 30 and a second opening 323 for the second elastic element 650 to pass through the middle rail 30.

Referring to FIG. 2, the first guiding groove 66 and the second guiding groove 67 are both transversely defined through the middle rail 30. The first guiding groove 66 is for guiding the first roller 63 to slide relative to the middle rail 30 in a direction substantially perpendicular to the sliding direction (an arrow shown in FIG. 5) of the inner rail 10. The second guiding groove 67 is for guiding the second roller 64 to slide relative to the middle rail 30 in a direction substantially perpendicular to the sliding direction of the inner rail 10. The first guiding groove 66 includes a first guiding groove valley 661 and a first guiding groove peak 662 that is larger than the first guiding groove valley 661. The second guiding groove 67 includes a second guiding groove valley 671 and a second guiding groove peak 672 that is larger than the second guiding groove valley 661.

The resisting portion 68 protrudes from the middle rail 30 toward the outer rail 50. The resisting portion 68 is for resisting the outer rail 50 so the middle rail 30 and the outer rail 50 can slide together relative to the inner rail 10.

The outer rail 50 has two sliding slots 52 respectively defined at opposite sides thereof. Each sliding slot 52 slidably engages with one of the sliding blocks 34 so the outer rail 50 can slide relative to the middle rail 30.

Referring also to FIG. 2, the third protrusion 69 is substantially arcuate, and includes a third protrusion valley 691 and a third protrusion peak 693 communicating with the third protrusion valley 691. The third protrusion 69, in this exemplary embodiment, is positioned at one side of the outer rail 50 facing the middle rail 30 and near one end of the outer rail 50. The outer rail 50 further defines a latching slot 695, which slidably engages with the resisting portion 68. The latching slot 695 communicates with the third protrusion peak 693, and a stopping surface 697 and a resisting surface 696 are defined in the latching slot 695. The stopping surface 697 is opposite to the third protrusion peak 693 and the resisting surface 696 is near the third protrusion peak 693.

Referring also to FIG. 2, the first roller 63 includes a main body 631, a first pin 633 protruding from one side of the main body 631, a second pin 635 protruding from another side of the main body 631. A retaining slot 637 defined around the first pin 633 near the main body 631 and a securing slot 639 defined around the second pin 635 near the main body 631. The first pin 633 slides along the first protrusion 61 when the middle rail 30 slides relative to the inner rail 10, and the second pin 635 slides along the third protrusion 69 when the middle rail 30 slides relative to the outer rail 50. The retaining slot 637 is for retaining the first elastic element 65 on the first roller 63. The securing slot 639 is for slidably securing with the portions of the middle rail 30 surrounding the first guiding groove valley 661 so the first roller 63 is slidably secured to the middle rail 30. In this exemplary embodiment, the second pin 635 is smaller than the first guiding groove peak 662 so the second pin 635 can pass through the first guiding groove peak 662. It is larger than the first guiding groove valley 661 to prevent the second pin 635 and the middle rail 30 from separating when the second pin 635 is located in the first guiding groove valley 661.

The second roller 64 has the same shape as the first roller 63, and includes a main board 641, a first post 643 protruding from one side of the main board 641, a second post 645 protruding from another side of the main board 641. A retaining groove 647 is defined around the first post 643 near the main board 641 and a securing groove 649 is defined around the second post 645 near the main board 641. The first post 643 slides along the second protrusion 62 when the middle rail 30 slides relative to the inner rail 10, and the second post 645 slides along the third protrusion 69 when the middle rail 30 slides relative to the outer rail 50. The retaining groove 647 is for retaining the second elastic element 650 on the second roller 64. The securing groove 649 is for slidably securing with the portions of the middle rail 30 surrounding the second guiding groove valley 671 so the second roller 64 is slidably secured to the middle rail 30. In this exemplary embodiment, the second post 645 is smaller than the second guiding groove peak 672 so the second post 645 can pass through the second guiding groove peak 672, and is larger than the second guiding groove valley 671. This prevents the second post 645 and the middle rail 30 from separating when the second post 645 is located in the second guiding groove valley 671.

The first elastic element 65 is V-shaped and includes a first latching portion 651 formed at the center thereof, a first inserting portion 652 formed at one end thereof and a first retaining ring 655 formed at another end thereof. The first latching portion 651 latches with the first hook 324 to hold the first elastic element 65 to the middle rail 30. The first inserting portion 652 is inserted in the first opening 322 to assist the first elastic element 65 to hold the middle rail 30. The first retaining ring 655 wraps in the retaining slot 637 to latch the first elastic element 65 to the first roller 63.

The second elastic element 650 has the same shape as the first elastic element 65, and includes a second latching portion 656 formed at the center thereof, a second inserting portion 657 formed at one end thereof and a second retaining ring 658 formed at another end thereof. The second latching portion 656 latches with the second hook 325 to hold the second elastic element 650 to the middle rail 30. The second inserting portion 657 is inserted in the second opening 323 to assist the second elastic element 650 to hold the middle rail 30. The second retaining ring 658 wraps in the retaining slot 637 to latch the second elastic element 650 to the second roller 64.

Referring to FIGS. 1-4, in assembly, the first inserting portion 652 passes through the first opening 322 until the first inserting portion 652 is located between the first guiding groove peak 662 and the first guiding groove valley 661. The first latching portion 651 latches with the first hook 324 so the first elastic element 65 is latched to the middle rail 30. The first retaining ring 655 wraps in the retaining slot 637 to retain the first roller 63 to the first elastic element 65. The second pin 635 passes through the first guiding groove peak 662 until the securing slot 639 is located in the first guiding groove peak 662. Then the second pin 635 slides to the first guiding groove valley 661 so the securing slot 639 slidably latches with the portion of the middle rail 30 surrounding the first guiding groove valley 661. The second elastic element 650 is latched to the middle rail 30 like the way of the first elastic element 65. The second roller 64 is retained to the second elastic element 650 and slidably latches with the middle rail 30 like the first roller 63.

Each sliding plate 14 is slidably accommodated in one of the sliding grooves 342 so the inner rail 10 is slidably mounted to the middle rail 30. At this time, the second pin 635 is located in the first guiding groove valley 661 and the first elastic element 65 is expanded; the first post 643 resists the second protrusion peak 623 and the second elastic element 650 is compressed. Finally, each sliding block 34 is slidably accommodated in one of the sliding slots 52 so the middle rail 30 is slidably mounted to the outer rail 50. At this stage, the second protrusion peak 623 is leveled with the third protrusion peak 693 and the first protrusion peak 613 is leveled with the latching slot 695 along a sliding direction of the sliding mechanism.

Figure 5:
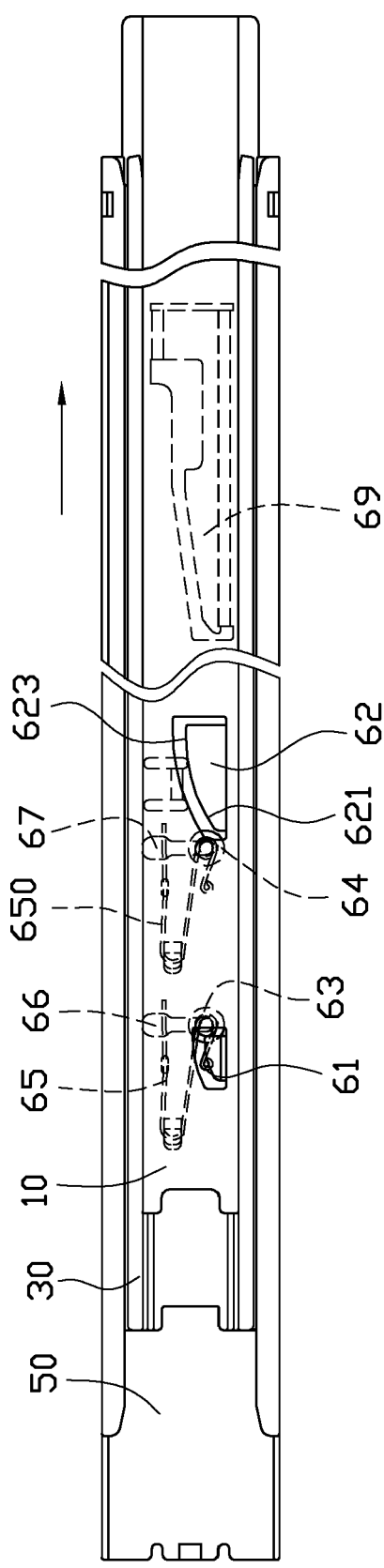

Referring to FIG. 5, in use, the inner rail 10 is dragged and slides a first predetermined distance in the direction of the arrow shown in FIG. 5, until the first post 643 slides from the second protrusion peak 623 to the second protrusion valley 621 and the first pin 633 is latched by the first protrusion 61. In this state, the inner rail 10 and the middle rail 30 are latched together such that the inner rail 10 can slide with the middle rail 30. At this stage, the first post 643 slides to the second guiding valley 671 to expand the second elastic element 650.

Figure 6:
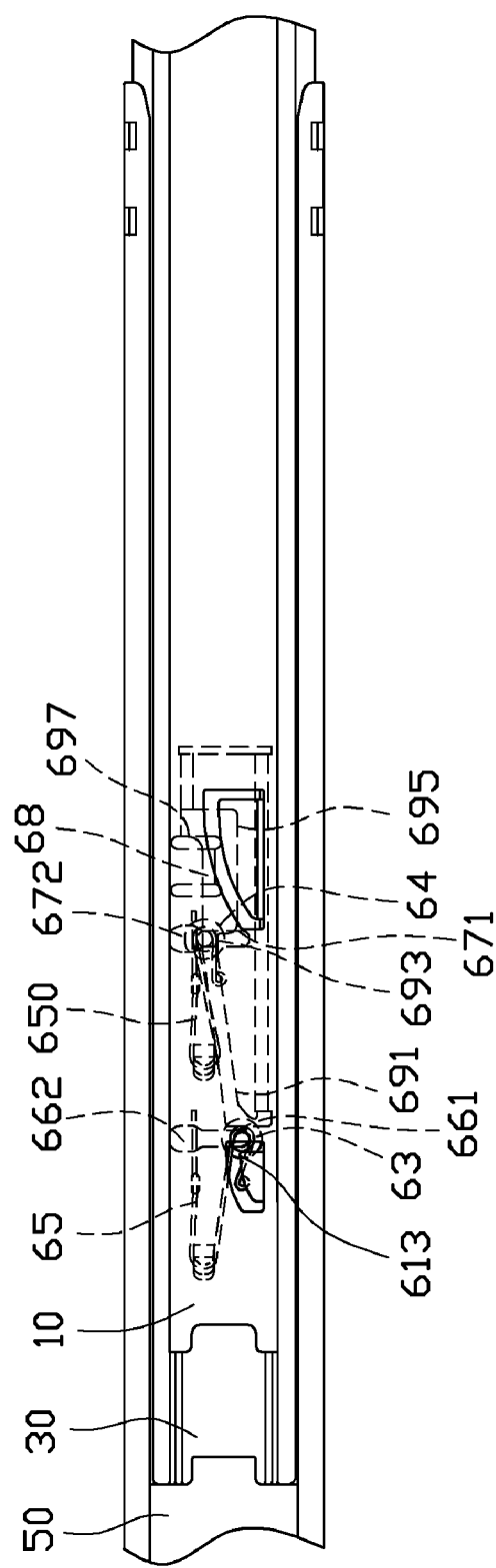

Referring to FIG. 6, continuing to drag the inner rail 10, because the first pin 633 is latched by the first protrusion 61, the inner rail 10, together with the middle rail 30, slides relative to the outer rail 50. As the inner rail 10 and the middle rail 30 slide relative to the outer rail 50, the second post 645 slides from the third protrusion valley 691 to the third protrusion peak 693 so the second roller 64 slides from the second guiding groove valley 671 toward the second guiding groove peak 672. The second inserting portion 657 stops the second roller 64 from sliding to the second guiding groove peak 672 to prevent the second roller 64 from sliding out of the second guiding groove 67. At this time, the second elastic element 650 is compressed and the first roller 63 locates at the third protrusion valley 691.

Figure 7:
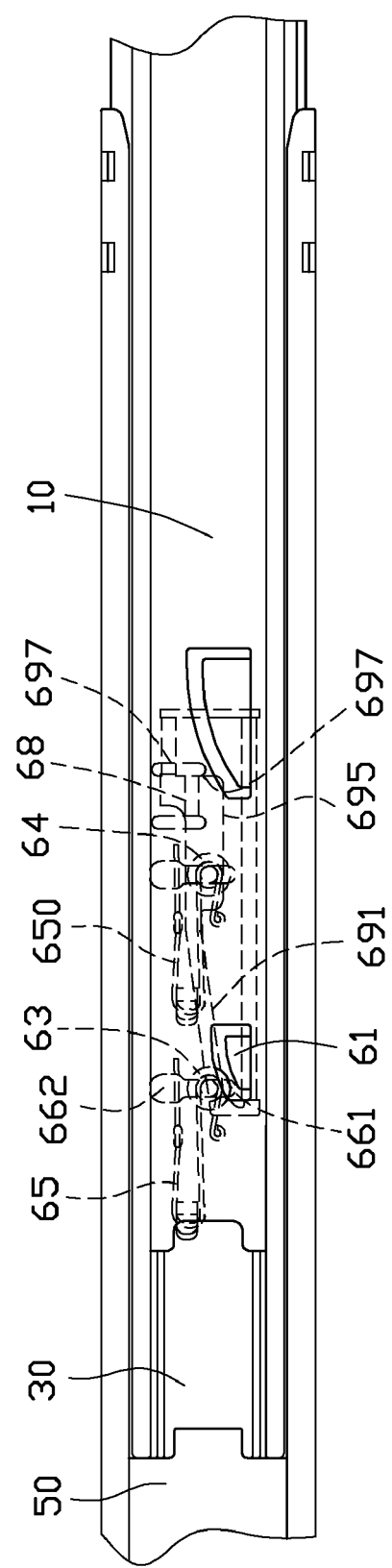

Referring to FIG. 7, the inner rail is continued to be pulled and slides together with the middle rail 20 a second predetermined distance until the second pin 635 slides to the third protrusion 69. Then the second pin 635 slides from the third protrusion valley 691 to the third protrusion peak 693 to drive the second pin 635 to slide from the first guiding groove valley 661 toward the first guiding groove peak 662. The first pin 633 can then pass through the first protrusion peak 613 making the first pin 633 release with the first protrusion 61. That is, the inner rail 10 may slide relative to the middle rail 30 again. Simultaneously, the second post 645 slides from the third protrusion peak 693 to the latching slot 695 until the resisting portion 68 resists the stopping surface 697 to prevent the middle rail 30 from continuing to slide relative to the outer rail 50. Continuing to pull the inner rail 10 makes the inner rail 10 slide relative to the middle rail 30, the first pin 633 slides to the first protrusion valley 611 so the inner rail 10 can further extend relative to the middle rail 30. Thus, the inner rail 10 is extended relative to the middle rail 30 and the outer rail 50 like shown in FIG. 7.

Figure 8:
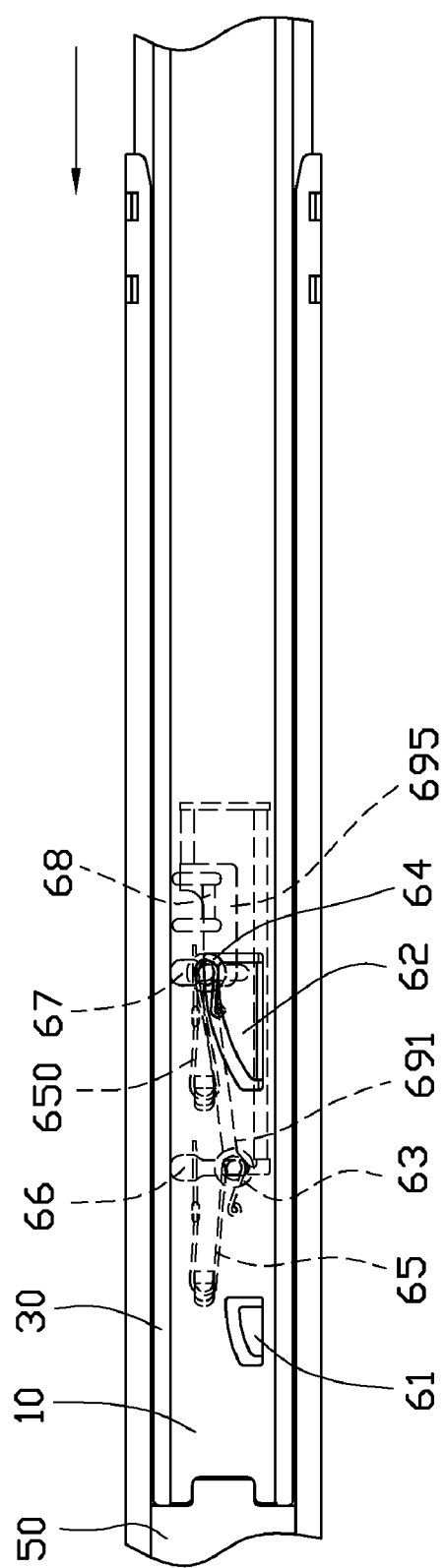

Referring to FIGS. 7 and 8, to push the inner rail 10 to its original state. The inner rail 10 is pushed in the direction of the arrow shown in FIG. 8 to slide relative to the middle rail 30, as the first pin 633 latches in the first protrusion valley 611. The middle rail 30 will then slide together with the inner rail 10 until the second post 645 resists against the resisting surface 696. Once the second post 645 resists against the resisting surface 696, the middle rail 30, and the outer rail 50 are latched with each other to prevent the middle rail 30 from sliding relative to the outer rail 50. While continuing to push the inner rail 10 in the direction of arrow shown in FIG. 8, the inner rail 10 continues to slide relative to the middle rail 30 with the first pin 633 sliding from the first protrusion valley 611 to the first protrusion peak 613. The first post 643 then slides from the second protrusion valley 621 to the second protrusion peak 623. Once the first post 643 slides to the second protrusion peak 623, the second post 645 passes through the third protrusion peak 693 to release the middle rail 30 from the outer rail 50. Thus, the middle rail 30 can slide together with the inner rail 10 relative to the outer rail 50 until the middle rail 30 and the inner rail 10 slide to their original state like shown in FIG. 4.

It is to be further understood that even though numerous characteristics and advantages of the exemplary embodiments have been set forth in the foregoing description, together with details of structures and functions of various embodiments, the disclosure is illustrative only, and changes may be made in detail, especially in matters of shape, size, and arrangement of parts within the principles of the exemplary invention to the full extent indicated by the broad general meaning of the terms in which the appended claims are expressed.

What is claimed is:

1. A sliding mechanism, comprising:
    an outer rail;
    an inner rail;
    a middle rail between the outer rail and the inner rail, the middle rail having a resisting portion protruding therefrom, the middle rail slidably mounted to the outer rail in a first direction and the inner rail slidably mounted to the middle rail in the first direction;
    a latching assembly including a first protrusion positioned at the inner rail, a second protrusion positioned at the inner rail and spaced apart from the first protrusion, a third protrusion positioned at the outer rail, a first roller and a second roller being slidably mounted on the middle rail in a second direction perpendicular to the first direction, a latching slot defined in the outer rail communicating with the third protrusion and a stopping surface defined in the latching slot opposite to the third protrusion;
    wherein the middle rail defines a first guiding groove to guide the first roller to slide relative to the middle rail in the second direction and a second guiding groove to guide the second roller to slide relative to the middle in the second direction;
    when the inner rail slides relative to the middle rail in the first direction, the second roller slides along the second protrusion until the first protrusion slides to and latches the first roller to make the middle rail sliding with the inner rail; and then the second roller slides along the third protrusion and the second guiding groove, the first roller slides to and along the third protrusion so the first roller slides along the first guiding groove relative to the middle rail in the second direction to release the first roller from the first protrusion and the second roller slides in the latching slot from the third protrusion in the first direction until the resisting portion resists the stopping surface to prevent the middle rail from sliding relative to the outer rail such that the first roller slides along the first protrusion to make the inner rail further extends relative to the middle rail.

2. The sliding mechanism as claimed in claim 1, wherein the inner rail includes two sliding plates respectively located at opposite sides thereof; the middle rail includes two sliding blocks respectively positioned at opposite sides thereof, each sliding block defines a sliding groove which slidably engages one of the sliding plates to enable the middle rail to slide relative to the inner rail.

3. The sliding mechanism as claimed in claim 2, wherein the outer rail has two sliding slots respectively defined at opposite sides thereof, each sliding slot slidably engages with one of the sliding blocks so the outer rail can slide relative to the middle rail.

4. The sliding mechanism as claimed in claim 1, wherein the first protrusion and the second protrusion are both positioned at one side of the inner rail facing the middle rail, and the first protrusion is spaced apart from the second protrusion.

5. The sliding mechanism as claimed in claim 4, wherein the first protrusion includes a first protrusion valley and a first protrusion peak; the second protrusion includes a second protrusion valley and a second protrusion peak; the third protrusion includes a third protrusion valley and a third protrusion peak.

6. The sliding mechanism as claimed in claim 5, wherein the first roller includes a main body, a first pin protruding from one side of the main body, a second pin protruding from another side of the main body; the first pin slides along the first protrusion when the middle rail slides relative to the inner rail, and the second pin slides along the third protrusion when the middle rail slides relative to the outer rail.

7. The sliding mechanism as claimed in claim 6, wherein the first roller further defines a securing slot around the second pin near the main body, the securing slot slidably secures with the portions of the middle rail surrounding the first guiding groove so the first roller is slidably secured to the middle rail.

8. The sliding mechanism as claimed in claim 7, wherein the first roller further defines a retaining slot defined around the first pin near the main body; the sliding mechanism further includes a first elastic element including a first retaining ring formed one end thereof and wrapping in the retaining slot to latch the first roller to the first elastic element.

9. The sliding mechanism as claimed in claim 8, wherein the first elastic element further includes a first latching portion formed at the center thereof; the middle rail further includes a first hook latching the first latching portion to hold the first elastic element to the middle rail.

10. The sliding mechanism as claimed in claim 9, wherein the middle rail further includes a first opening; the first elastic element further includes a first inserting portion formed another end thereof which is inserted in the first opening to assist the first elastic element to hold on the middle rail.

11. The sliding mechanism as claimed in claim 10, wherein the second roller includes a main board, a first post protruding from one side of the main board, a second post protruding from another side of the main board; the first post slides along the second protrusion when the middle rail slides relative to the inner rail, and the second post slides along the third protrusion when the middle rail slides relative to the outer rail.

12. The sliding mechanism as claimed in claim 11, wherein the second roller further defines a securing groove around the second post near the main board, the securing groove slidably secures with the portions of the middle rail surrounding the second guiding groove so the second roller is slidably secured to the middle rail.

13. The sliding mechanism as claimed in claim 12, wherein the second roller further defines a retaining groove defined around the first post near the main board; the sliding mechanism further includes a second elastic element including a first retaining ring formed one end thereof and wrapping in the retaining groove to latch the second roller to the second elastic element.

14. The sliding mechanism as claimed in claim 13, wherein the second elastic element further includes a second latching portion formed at the center thereof;

the middle rail further includes a second hook latching the second latching portion to hold the second elastic element to the middle rail.

15. The sliding mechanism as claimed in claim 14, wherein the middle rail further includes a second opening; the second elastic element further includes a second inserting portion formed another end thereof which is inserted in the second opening to assist the second elastic element to hold on the middle rail.

16. The sliding mechanism as claimed in claim 5, wherein the latching slot communicates with the third protrusion peak, and the stopping surface is defined opposite to the third protrusion peak and a resisting surface is defined in the latching slot near the third protrusion peak.

* * * * *